(12) United States Patent
Xuan et al.

(10) Patent No.: US 11,727,841 B2
(45) Date of Patent: Aug. 15, 2023

(54) DRIVING BACKPLANE, DISPLAY PANEL AND DISPLAY DEVICE

(71) Applicant: BOE TECHNOLOGY GROUP CO., LTD., Beijing (CN)

(72) Inventors: Minghua Xuan, Beijing (CN); Haoliang Zheng, Beijing (CN); Liang Chen, Beijing (CN); Qi Qi, Beijing (CN); Jing Liu, Beijing (CN); Dongni Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/475,529

(22) Filed: Sep. 15, 2021

(65) Prior Publication Data
US 2022/0246074 A1    Aug. 4, 2022

(30) Foreign Application Priority Data
Jan. 29, 2021 (CN) .......................... 202110129837.6

(51) Int. Cl.
*G09G 3/20* (2006.01)
*G09G 3/32* (2016.01)
*H01L 23/522* (2006.01)
*H01L 27/12* (2006.01)
*H01L 23/552* (2006.01)

(52) U.S. Cl.
CPC .................. *G09G 3/20* (2013.01); *G09G 3/32* (2013.01); *H01L 23/5226* (2013.01); *H01L 23/552* (2013.01); *H01L 27/124* (2013.01); *G09G 2300/0408* (2013.01); *G09G 2300/0426* (2013.01); *G09G 2300/0852* (2013.01); *G09G 2310/0267* (2013.01)

(58) Field of Classification Search
CPC .... G09G 3/20; G09G 3/32; G09G 2300/0408; G09G 2300/0426; G09G 2300/0852; G09G 2310/0267; H01L 23/5226; H01L 23/552; H01L 27/124
See application file for complete search history.

(56) References Cited

U.S. PATENT DOCUMENTS

| 2017/0131585 A1* | 5/2017 | Cho ..................... H01L 27/1259 |
| 2017/0148374 A1* | 5/2017 | Lee .......................... G09G 5/14 |
| 2020/0075639 A1* | 3/2020 | Li ........................ H01L 27/1244 |

FOREIGN PATENT DOCUMENTS

| CN | 111063660 A | * | 4/2020 | |
| WO | WO-2008042110 A2 | * | 4/2008 | ........... H01L 27/124 |
| WO | WO-2021072836 A1 | * | 4/2021 | ......... H01L 27/1214 |

* cited by examiner

*Primary Examiner* — Stephen G Sherman
(74) *Attorney, Agent, or Firm* — Dinsmore & Shohl LLP

(57) ABSTRACT

The present disclosure provides a driving backplane, a display panel and a display device. The driving backplane comprises: a base substrate having a plurality of first conductive vias; a pixel circuit layer disposed on the base substrate and comprising a plurality of pixel circuits and a plurality of signal lines; a conductive portion, at least part of which is disposed in one first conductive via; a conductive pattern layer disposed on the base substrate and comprising a plurality of first conductive patterns; and a shielding layer disposed between the pixel circuit layer and the conductive pattern layer and having a plurality of hollow areas; wherein each of the plurality of signal lines is coupled to one first conductive pattern through at least one of the conductive portions.

18 Claims, 8 Drawing Sheets

DRIVING BACKPLANE, DISPLAY PANEL AND DISPLAY DEVICE

CROSS-REFERENCE TO RELATED APPLICATIONS

This application claims the priority to the Chinese patent application No. 202110129837.6 filed on Jan. 29, 2021, the disclosure of which is hereby incorporated by reference in its entirety into the present application.

TECHNICAL FIELD

The present disclosure relates to the technical field of display, and particularly, to a driving backplane, a display panel and a display device.

BACKGROUND

A display panel comprises a driving backplane, a driving circuit and a plurality of sub-pixels, at least one sub-pixel comprises a pixel circuit, and each pixel circuit comprises at least two thin film transistors. All pixel circuits herein are contained in a pixel circuit layer of the driving backplane, and the pixel circuit layer is disposed on a base substrate of the driving backplane and is one of a plurality of film layers contained in the driving backplane.

The driving circuit is disposed on a side of the base substrate away from the pixel circuit, is coupled to the driving backplane through an extended pad type wiring (or called Fanout wiring, etc.) also disposed on the side of the base substrate away from the pixel circuit, and outputs a plurality of changing electric signals to the driving backplane so as to drive the pixel circuit on the driving backplane. However, the plurality of changing electrical signals transmitted by the extended pad type wiring will cause signal interference to the thin film transistor in the pixel circuit of the driving backplane, and eventually have a bad influence on the display effect of the display panel.

SUMMARY

Embodiments of the present disclosure provide a driving backplane, a display panel and a display device, for solving a problem that a plurality of changing electric signals transmitted by the extended pad type wiring will cause signal interference to the thin film transistor in the pixel circuit of the driving backplane.

In order to achieve the above objective, the embodiments of the present disclosure adopt the following technical solutions:

In a first aspect, a driving backplane is provided comprising: a base substrate having a plurality of first conductive vias; a plurality of conductive portions, at least part of each of which is disposed in one first conductive via; a pixel circuit layer disposed on the base substrate and comprising a plurality of pixel circuits and a plurality of signal lines, each signal line coupled to at least one of the pixel circuits; a conductive pattern layer located on a side of the base substrate away from the pixel circuit layer and comprising a plurality of first conductive patterns; and a shielding layer located between the pixel circuit layer and the conductive pattern layer, wherein orthographic projections of the plurality of pixel circuits on the base substrate and an orthographic projection of the shielding layer on the base substrate have an overlapping area, the shielding layer has a plurality of hollow areas, and at least one of the conductive portions is located in one hollow area; wherein each of the plurality of signal lines is coupled to one first conductive pattern through at least one of the conductive portions.

In some embodiments, the conductive portion comprises: a first connection portion filled in the first conductive via, and a second connection portion located outside the first conductive via and in contact with the first connection portion; and the second connection portion and the shielding layer are disposed in a same layer.

In some embodiments, the base substrate further has a second conductive via; the driving backplane further comprises a third connection portion located in the second conductive via; the conductive pattern layer further comprises a second conductive pattern; and the shield layer is coupled to the second conductive pattern through the third connection portion.

In some embodiments, the pixel circuit layer further comprises: a GOA circuit connected to the plurality of pixel circuits; and the plurality of signal lines comprise: a plurality of GOA circuit control signal lines coupled to the GOA circuit, each GOA circuit control signal line being configured to transmit a control signal to the GOA circuit.

In some embodiments, the plurality of signal lines comprise: at least one of gate lines, data lines, first power voltage lines and second power voltage lines.

In some embodiments, an edge closest to first conductive patterns coupled to the plurality of data lines among edges of the base substrate is a first edge; an edge closest to first conductive patterns coupled to the plurality of first power voltage lines and second power voltage lines among the edges of the base substrate is a second edge; and the first edge is parallel to the second edge.

In some embodiments, each conductive pattern comprises: a conductive lead and a conductive PAD; the conductive lead has one end coupled to one signal line through at least one of the plurality of conductive portions, and has the other end coupled to the conductive PAD in the conductive pattern; the plurality of conductive patterns are divided into a plurality of groups, each group comprising at least two conductive patterns; and in each group, a distance between two adjacent conductive PADs is less than a distance between two adjacent conductive leads.

In some embodiments, an orthographic projection of an edge of the shielding layer on the base substrate completely coincides with the edge of the base substrate.

In a second aspect, a display panel is provided, comprising the driving backplane according to any of the first aspect, wherein the display panel further comprises a driving circuit located on a side of the base substrate away from the shielding layer, and the driving circuit is coupled to the conductive pattern layer.

In some embodiments, the driving circuit is coupled to the conductive pattern layer on the driving backplane through a flexible circuit board.

In some embodiments, each of first conductive patterns coupled to a plurality of data lines is coupled to a printed circuit board through a chip on film and the flexible circuit board sequentially.

In some embodiments, the driving circuit comprises a voltage end coupled to a second conductive pattern.

In some embodiments, the voltage end is a grounding end.

In some embodiments, the display panel further comprises at least one light emitting device configured to emit light under the driving of the driving backplane.

In a third aspect, a display device is provided, comprising the display panel of any of the second aspect.

In some embodiments, the display device is formed by splicing a plurality of the display panels.

The driving backplane provided by the embodiments of the present disclosure comprises a shielding layer located between the pixel circuit layer and the conductive pattern layer, wherein the orthographic projection of the edge of the shielding layer on the base substrate and the edge of the base substrate completely coincide, that is, the orthographic projection of the shielding layer on the base substrate completely covers the orthographic projection of the conductive pattern layer on the base substrate, so that interference, to a transistor, of a voltage signal output by the conductive pattern layer can be shielded to the greatest extent, and thus, a better display effect is achieved.

BRIEF DESCRIPTION OF THE DRAWINGS

In order to more clearly illustrate the technical solutions of the embodiments of the present disclosure, the accompanying drawings used in the embodiments or the description of the prior art will be briefly introduced below. It is obvious that the drawings in the following description are only some of the embodiments of the present disclosure, and other drawings can be obtained by one of ordinary skill in the art without making creative efforts.

FIG. 6(*b*) is a structural diagram of another first conductive pattern according to at least one embodiment of the present disclosure;

DETAILED DESCRIPTION

Figure 1:
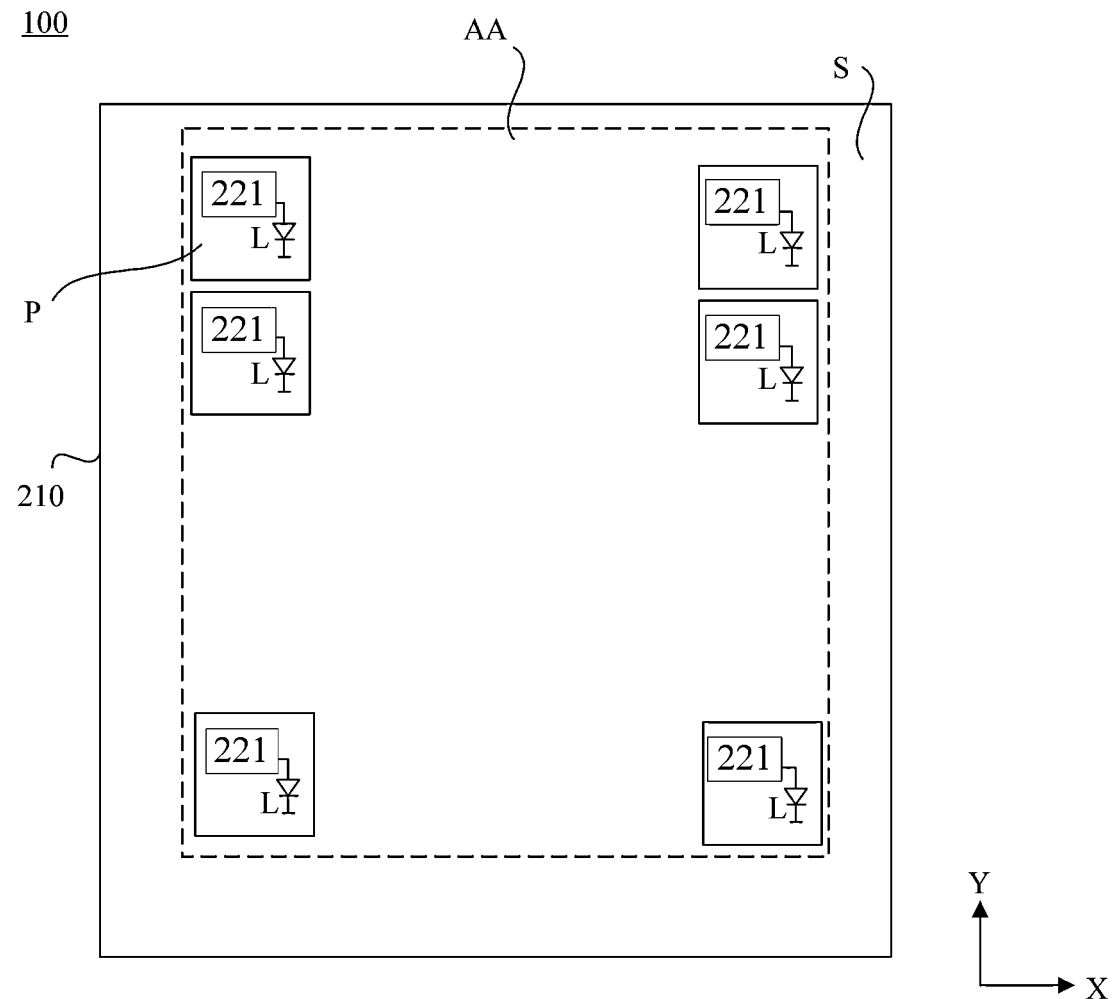
FIG. 1 is a structural diagram of a display panel according to at least one embodiment of the present disclosure.

The technical solutions in the embodiments of the present disclosure will be described clearly and completely in conjunction with the accompanying drawings in the embodiments of the present disclosure, and it is obvious that the described embodiments are only some of the embodiments of the present disclosure, rather than all of them. All other embodiments, which can be derived by those of ordinary skill in the art from the embodiments disclosed herein without making any creative effort, are intended to fall within the protection scope of the present disclosure.

In the description of the present disclosure, it is to be understood that orientation or position relations indicated by terms "center", "up", "down", "front", "rear", "left", "right", "vertical", "horizontal", "top", "bottom", "inside", "outside", and the like are based on those shown in the drawings, merely for ease of describing the present disclosure and simplifying the description, instead of indicating or implying that an indicated device or element must have a specific orientation and be constructed and operated in the specific orientation, and therefore, they should not be construed as limiting the present disclosure.

Unless otherwise required in the context, throughout the specification and the claims, a term "comprise" and its other forms, such as its third person singular form "comprises" and its present participle form "comprising", will be interpreted as open-minded, i.e., "including, but not limited to". In the description of the specification, terms "one embodiment", "some embodiments", "exemplary embodiments", "example", "specific example" or "some examples" and the like are intended to indicate that a specific feature, structure, material, or characteristic related to the embodiment or example is included in at least one embodiment or example of the present disclosure. The schematic representations of the above terms not necessarily refer to the same embodiment or example. In addition, the specific feature, structure, material, or characteristic can be included in any one or more embodiments or examples in any suitable manner.

Hereinafter, terms "first" and "second" are used for descriptive purposes only and cannot be understood as indicating or implying relative importance or implicitly indicating the number of indicated technical features. Thus, a feature defined as "first" or "second" can explicitly or implicitly include one or more of this feature. In the description of the embodiments of the present disclosure, "a plurality of" means two or more unless otherwise specified.

When some embodiments are described, expressions of "coupled" and "connected", together with their derivatives, may be used. For example, when some embodiments are described, a term "connected" may be used for indicating that two or more components are in direct physical or electrical contact with each other. As another example, when some embodiments are described, a term "coupled" may be used for indicating that two or more components are in direct physical or electrical contact with each other. However, the term "coupled" or "communicatively coupled" may also mean that two or more components are not in direct contact with each other, but yet still co-operate or interact with each other. The embodiments disclosed herein are not necessarily limited to the present disclosure.

"At least one of A, B and C" has the same meaning as "at least one of A, B or C", and both of them comprise the following combinations of A, B and C: A only, B only, C only, a combination of A and B, a combination of A and C, a combination of B and C, and a combination of A, B and C.

"A and/or B" comprises the following three combinations: A only, B only, and a combination of A and B.

"A plurality of" refers to at least two.

The use of "adapted to" or "configured to" herein is open-minded and inclusive, and does not exclude a device adapted to or configured to perform additional tasks or steps.

Additionally, the use of "based on" is open-minded and inclusive, since a process, step, calculation, or other actions "based on" one or more conditions or values can, in practice, be based on additional conditions or exceed the values.

As used herein, "about," "approximately," or "roughly" includes a stated value as well as an average value within an acceptable deviation range of the specific value, wherein the acceptable deviation range is determined by, for example, those of ordinary skill in the art taking into account measurement in question and errors related to measurement of a specific measure (i.e., the limitations of a measurement system).

Exemplary implementations are described herein with reference to cross-sectional and/or plan views as idealized exemplary drawings. In the drawings, thickness of layers and regions are enlarged for clarity. Thus, variations of shapes relative to the drawings due to, for example, manufacturing techniques and/or tolerances, can be envisaged. Thus, the exemplary implementations should not be construed as being limited to the shapes of regions shown herein, but are intended to include shape deviations due to, for example, manufacturing. For example, an etched region shown as a rectangle will typically have a curved feature. Thus, regions shown in the drawings are schematic in nature and their shapes are not intended to show actual shapes of regions of a device, and are not intended to limit the scope of the exemplary implementations.

In one aspect, some embodiments of the present disclosure provide a display device, which can be: a display device comprising a single display panel, such as a display, a television set, a billboard, a digital photo frame, a laser printer with a display function, a telephone, a mobile phone, a personal digital assistant (PDA), a digital camera, a portable video camera, a viewfinder, a navigator, a home appliance, an information inquiry device (e.g., a business inquiry device of a department such as an E-Government, bank, hospital, electric power), or a spliced display device formed by splicing a plurality of display panels, which is applied in fields of large-scale post and telecommunications systems, broadcasting television studio, security monitoring, military command, industrial process control, traffic management command, public security command and monitoring, various production scheduling, communication network management, energy distribution and transportation, etc., and used for meeting requirements of users for large-area display of various shared information and comprehensive information. Illustratively, the spliced display device can be formed by splicing A*B display panels, where A and B are both positive integers.

In some embodiments of the present disclosure, the display device can comprise: a touch panel (also known as a touch screen, touch structure, or touch layer) and a display panel 100. The touch panel is used for sensing a touch position, the display panel 100 is used for displaying an image, and the image displayed on the display panel can be controlled according to the touch position sensed by the touch panel, so that human-computer interaction is realized.

In some embodiments of the present disclosure, referring to FIG. 1, the display device can further comprise: a display panel 100 having an active area (AA area for short) and a peripheral area S. The peripheral area S herein is located on at least one side of the active area. Illustratively, the peripheral area S can be disposed around the active area.

Illustratively, the display panel 100 can be an OLED (Organic Light Emitting Diode) panel, a QLED (Quantum Dot Light Emitting Diode) panel, an LCD (Liquid Crystal Display) panel, a micro LED (including a miniLED or microLED) panel, etc.

Illustratively, referring to FIG. 1, the display panel 100 can comprise a plurality of sub-pixels P, which are located in the AA area. Illustratively, the plurality of sub-pixels P can be arranged in an array. For example, sub-pixels P arranged in a line in an X direction are called same-row pixels, and sub-pixels P arranged in a line in a Y direction are called same-column pixels.

Illustratively, the plurality of sub-pixels P includes a first color sub-pixel P, a second color sub-pixel P, and a third color sub-pixel P; for example, the first, second, and third colors are three primary colors; for example, the first, second, and third colors are red, green, and blue, respectively; that is, the plurality of sub-pixels P includes a red sub-pixel $P_R$, a green sub-pixel $P_G$, and a blue sub-pixel $P_B$.

Illustratively, referring to FIG. 1, at least one sub-pixel P (e.g., each sub-pixel P) of the display panel 100 comprises a pixel circuit 221 and a light emitting device L. The pixel circuit 221 herein is coupled to the light emitting device L. The pixel circuit 221 is configured to drive the light emitting device L to emit light. Illustratively, the plurality of pixel circuits are arranged in an array.

Figure 3:
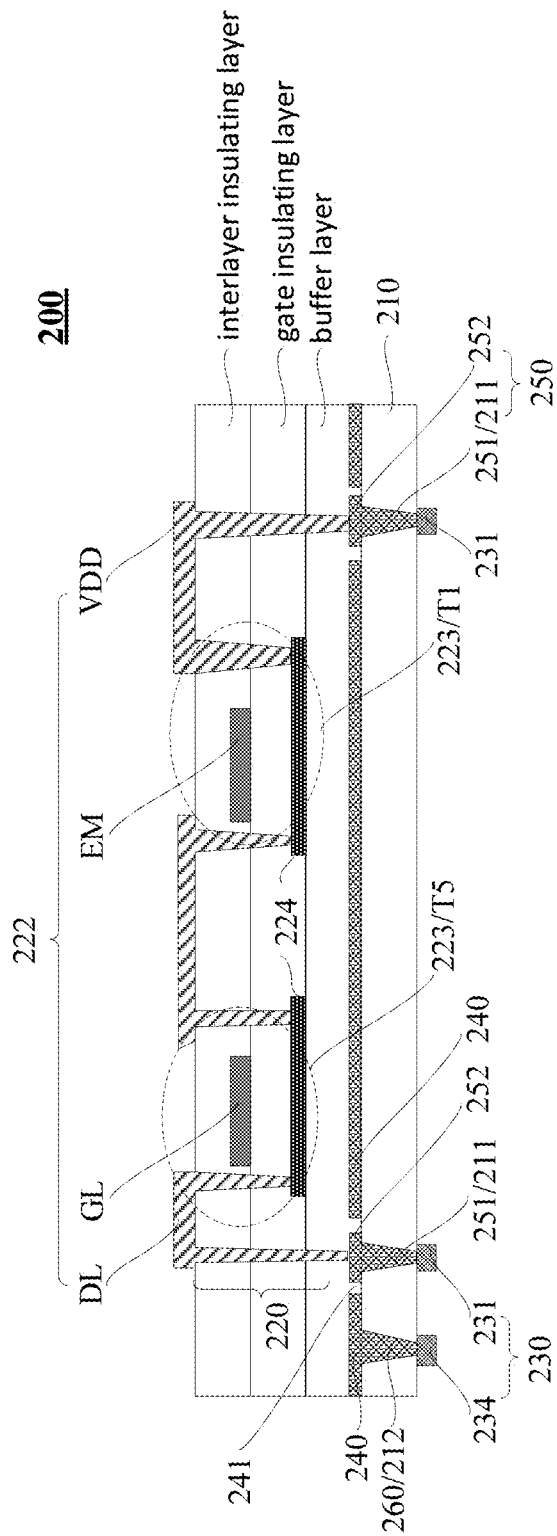
FIG. 3 is a cross-sectional view of a driving backplane according to at least one embodiment of the present disclosure.
Figure 4:
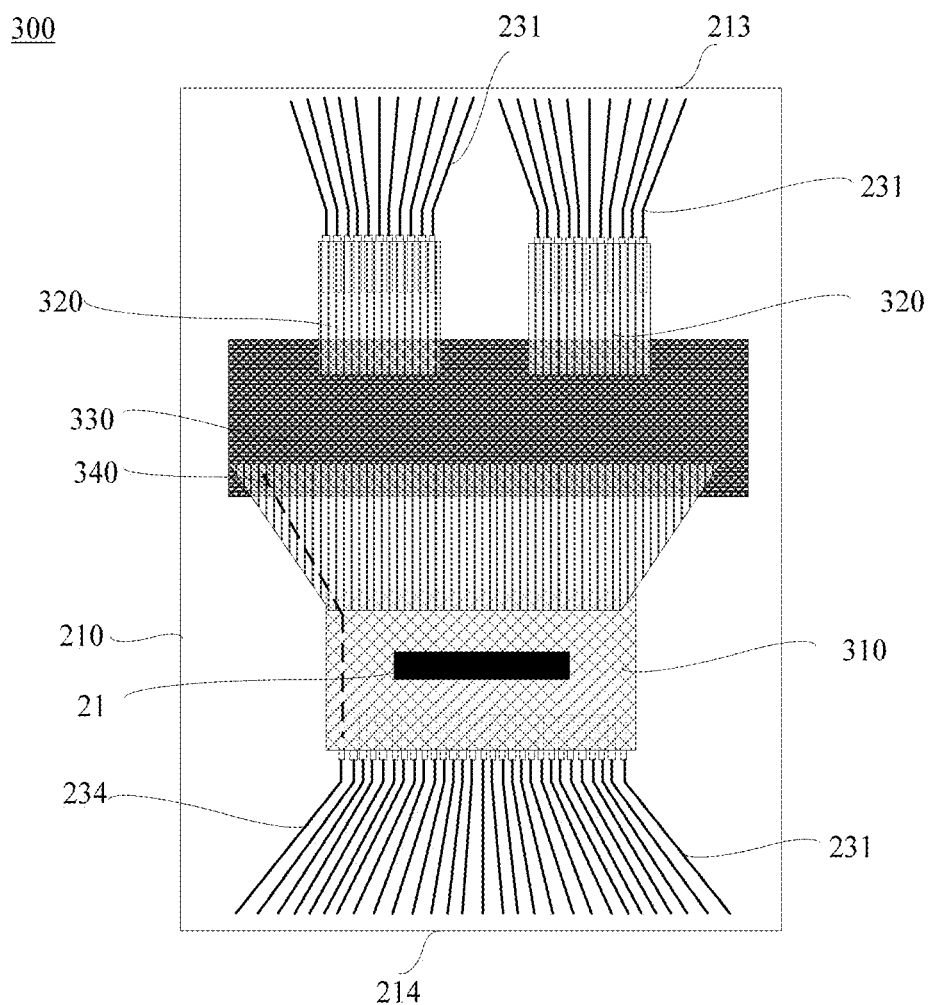
FIG. 4 is a structural diagram of a driving circuit according to at least one embodiment of the present disclosure.
Figure 5:
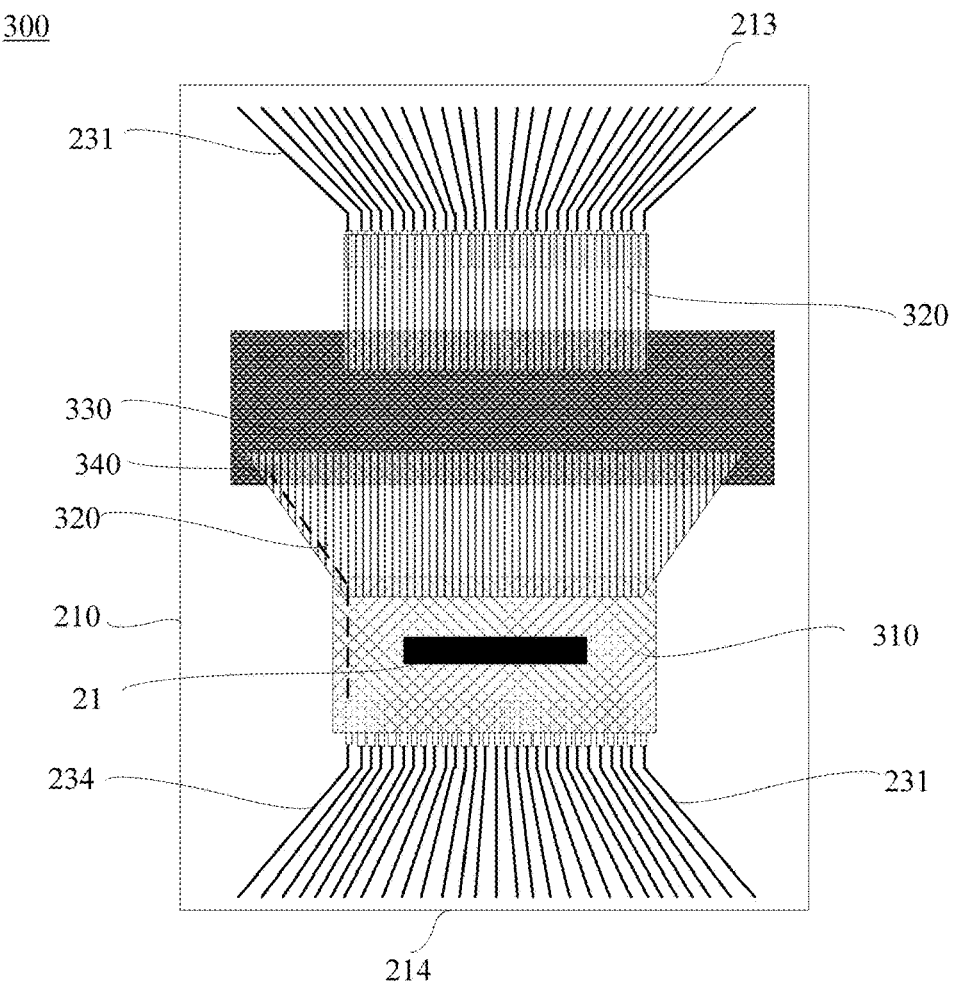
FIG. 5 is a structural diagram of another driving circuit according to at least one embodiment of the present disclosure.

Illustratively, referring to FIGS. 3 to 5, the display panel 100 comprises a driving circuit 300, a driving backplane 200, and at least one (e.g., which can be a plurality of) light emitting device L. The driving circuit 300 is configured to provide a driving signal to the driving backplane 200, and the driving backplane 200 is configured to drive the light emitting device L to emit light under the control of the driving signal.

Illustratively, referring to FIGS. 4 to 5, the driving Circuit 300 comprises at least one (e.g., which can be one) printed circuit board 330 (PCB for short), at least one (e.g., which can be one) chip on film 310 (COF for short), and a plurality of flexible printed circuits 320 (FPC for short). The chip on film 310 herein is coupled to one flexible printed circuit 320, and the plurality of flexible printed circuits 320 are all coupled to the printed circuit board 330.

In another aspect, some embodiments of the present disclosure provide a driving backplane 200. Referring to FIG. 3, the driving backplane 200 comprises a base substrate 210, a pixel circuit layer 220 disposed on the base substrate 210, a conductive pattern layer 230 disposed on a side of the base substrate 210 away from the pixel circuit layer 220, and a shielding layer 240 disposed between the pixel circuit layer 220 and the conductive pattern layer 230.

Various parts of the driving backplane 200 will described in detail below.

Illustratively, the base substrate 210 is configured to carry a plurality of film layers of the driving backplane 200, such as a buffer layer, a gate insulating layer, an interlayer insulating layer, and the like. For example, the base substrate can be a rigid base substrate; and the rigid substrate can be, for example, a glass base substrate, a PMMA (Polymethyl methacrylate) base substrate, or the like. As another example, the base substrate can be a flexible base substrate; and the flexible base substrate can be, for example, a PET (Polyethylene terephthalate) substrate, a PEN (Polyethylene naphthalate two formic acid glycol ester) substrate, a PI (Polyimide) substrate, or the like.

Illustratively, referring to FIG. 3, the base substrate 210 has a plurality of first conductive vias 211 and at least one (e.g., which can be one) second conductive via 212. Illustratively, the first conductive via 211 and the second conductive via 212 are both vias passing through the base substrate 210, and for the first conductive via 211 and the second conductive via 212, shapes of their respective two openings on up and down two side surfaces of the base substrate 210 can be any of a polygon, a circle, an ellipse, and the like; the polygon includes: hexagon, quadrangle, or triangle, etc., wherein the quadrangle can be rectangle, square, parallelogram, etc., which is not limited herein. It will be appreciated that sizes of the above two openings can also be different. For example, a surface of one side of the base substrate 210 close to the pixel circuit layer 220 is an upper surface, a surface of its other side is a lower surface, shapes of the two openings of the first conductive via 211 on the surfaces of the two sides of the base substrate 210 are both circular, a diameter of the circular opening on the upper surface of the base substrate 210 is greater than that of the circular opening on the lower surface of the base substrate 210, and a cross-sectional shape of the first conductive via 211 in a thickness direction of the base substrate 210 is an inverted trapezoid.

Figure 10:
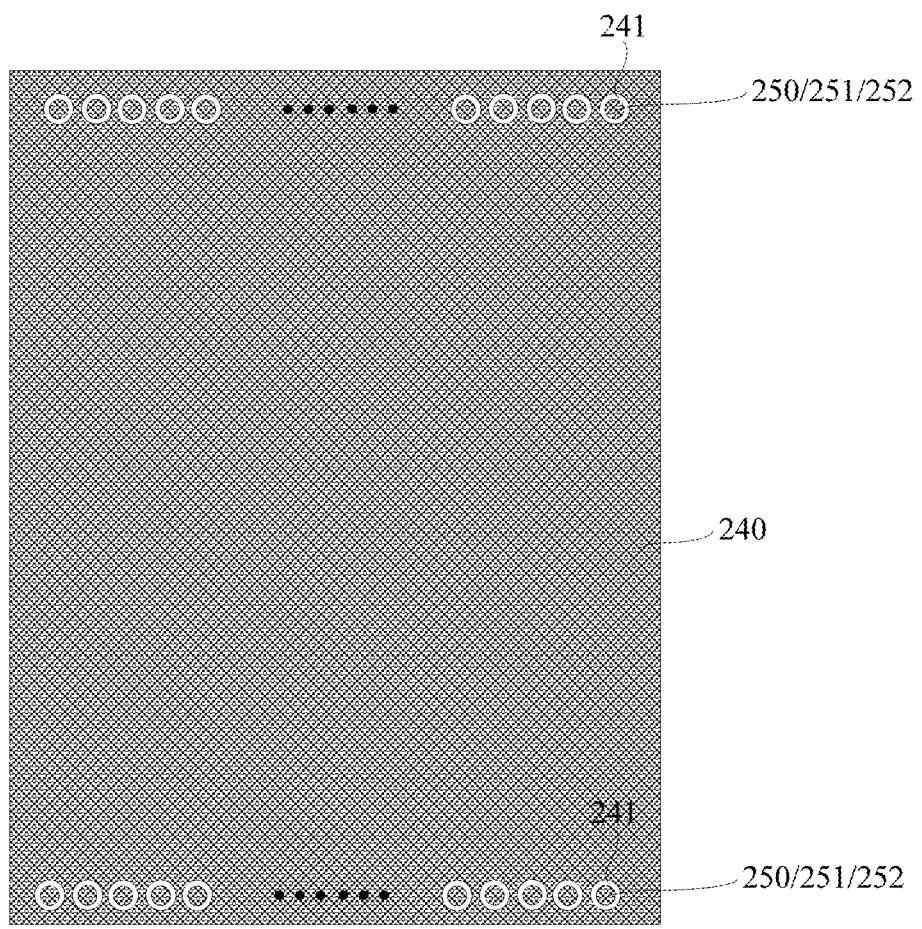
FIG. 10 is a structural diagram of a shielding layer having a plurality of hollow areas according to at least one embodiment of the present disclosure.

Illustratively, referring to FIGS. 3 and 10, the driving backplane 200 further comprises a plurality of conductive portions 250, at least part of each conductive portion 250 is disposed in one first conductive via 211 and configured to achieve electrical connection between structures in contact with the conductive portion 250, i.e., an orthographic projection of each conductive portion 250 on the base substrate 210 contains an orthographic projection of each first conductive via 211 on the base substrate 210. Each conductive portion 250 comprises a first connection portion 251 filled in the first conductive via 211 and a second connection portion 252 located outside the first conductive via 211 and in contact with the first connection portion 251. Illustratively, an orthographic projection of the first connection portion 251 on the base substrate 210 is contained in an orthographic projection of the second connection portion 252 on the base substrate 210, and each first connection portion 251 is in direct contact with one second connection portion 252, wherein a shape of the second connection portion 252 is not limited.

Figure 2:
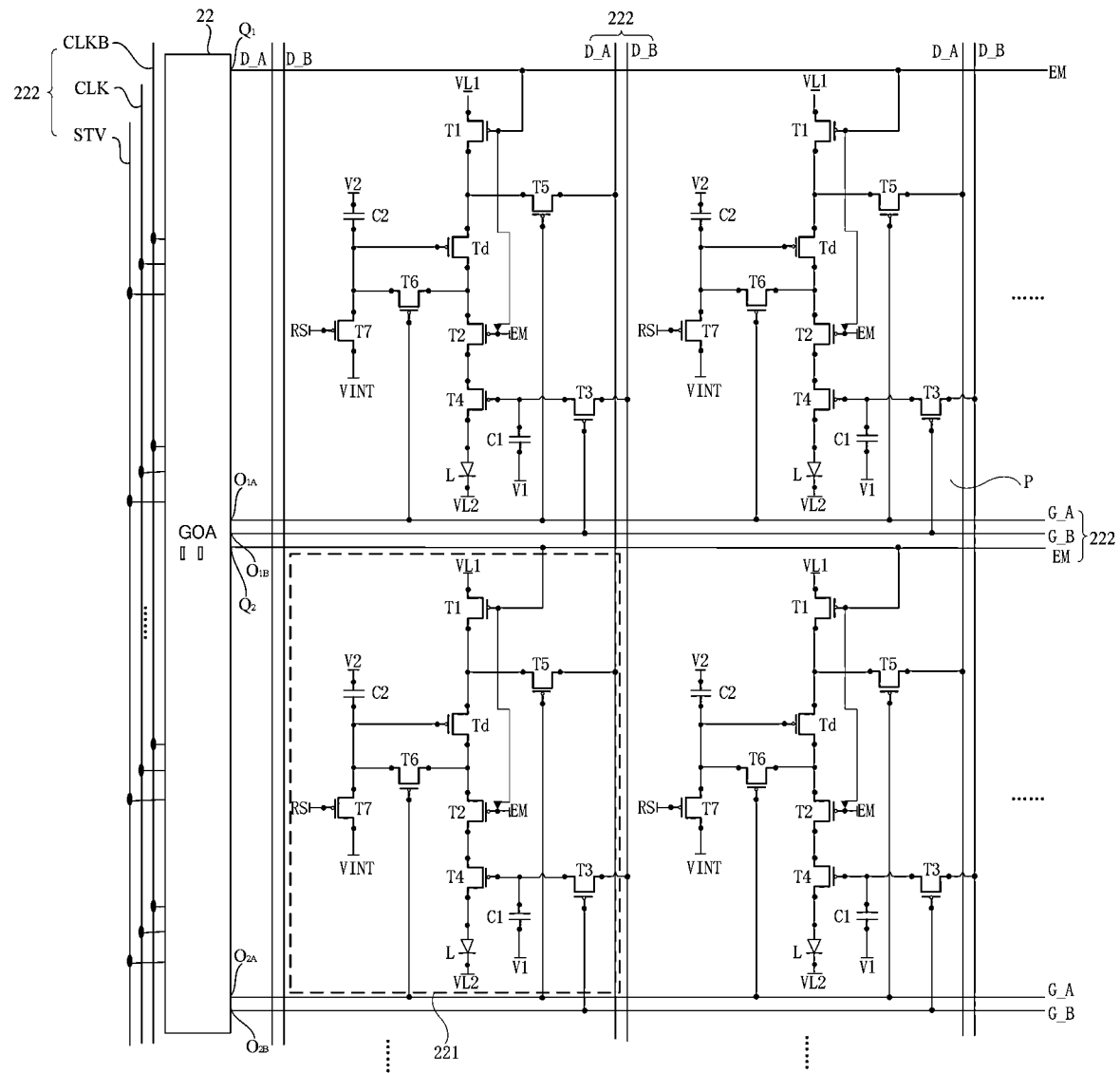
FIG. 2 is a structural diagram of a display panel comprising a GOA driving circuit according to at least one embodiment of the present disclosure.

Illustratively, referring to FIGS. 1 to 2, the pixel circuit layer 220 comprises a plurality of pixel circuits 221. A specific structure of the pixel circuit is not limited in the embodiments of the present disclosure, and can be designed according to actual situations. Illustratively, the pixel circuit 221 is composed of electronic devices such as thin film transistors 223 (TFTs for short), capacitors (Cs for short), and the like, each transistor comprising an active layer 224. For example, the pixel circuit 221 can comprise two thin film transistors (one switching transistor and one driving transistor) and one capacitor, which constitute a 2T1C structure; and of course, the pixel circuit can further comprise two or more thin film transistors (a plurality of switching transistors and one driving transistor) and at least one capacitor, for example, referring to FIG. 2, the pixel circuit 221 can comprise two storage capacitors Cst and eight transistors (seven switching transistors T1, T2, T3, T4, T5, T6, T7 and one driving transistor TD), which constitute an 8T2C structure.

Illustratively, a type of the transistor 223 is not limited. For example, the transistor 223 can be an oxide thin film transistor (Oxide TFT) or a low temperature polysilicon thin film transistor (LTPS TFT), and it is determined by characteristics of the above transistors that the use of the above transistors is advantageous for reducing an area of the pixel circuit 221, increasing pixel density per unit area, and achieving higher display resolution.

Illustratively, the pixel circuit layer 220 further comprises a plurality of signal lines 222. For example, as shown in FIG. 2, the pixel circuit 221 with the 8T2C structure is taken as an example. The driving backplane 200 comprises, in addition to the pixel circuit, a plurality of signal lines, for example, gate lines (GL), data lines (DL), emission control signal Lines EM, initialization signal lines Init, first power voltage lines VDD, second power voltage lines VSS, reset signal lines Reset, and the like. The gate line GL herein can be divided into a gate line GL_A and a gate line GL_B, the gate line GL can be configured to transmit a gate driving signal, and the gate lines GL_A and GL_B are respectively connected to a first scanning signal end G_A and a second scanning signal end G_B of the pixel circuit 221; the data line DL can be divided into a data line DL_A and a data line DL_B, the data line DL is configured to provide a data signal (data current or data voltage) for a to-be-driven element, so as to drive the to-be-driven element to operate, and the data line DL_A and the data line DL_B are respectively connected to a first data signal end D_A and a second data signal end D_B of the pixel circuit 221; a driving control signal line (e.g., the emission control signal line EM) can be configured to transmit a driving control signal (e.g., emission control signal), and the control signal line EM is connected to an emission control signal end EM of the pixel circuit 221; the first power voltage line VDD can be configured to transmit a power voltage signal, and is connected to a first operating voltage end VL1 of the pixel circuit 221; and the second power voltage line VSS can be configured to transmit a common voltage signal and is connected to a second operating voltage end VL2 of the pixel circuit 221. In addition, the pixel circuit 221 further comprises a reset control signal end RS, a reset voltage end VINT, a first voltage end V1, a second voltage end V2, etc. Herein, both the first voltage end V1 and the second voltage end V2 can be grounding ends.

Illustratively, the light emitting device L can employ a light emitting device including an LED (Light Emitting Diode), an OLED (Organic Light Emitting Diode), a QLED, or the like. The light emitting device L comprises a cathode and an anode, as well as an emission function layer between the cathode and the anode. The emission function Layer herein can include, for example, an emission layer E, a hole transporting layer (HTL) between the emission layer E and the anode, and an electron transporting layer (ETL) between the emission layer E and the cathode. Of course, in some embodiments, a hole injection layer (HIL) can be further disposed between the hole transporting layer (HTL) and the anode, and an electron injection layer (EIL) can be disposed between the electron transporting layer (ETL) and the cathode, as needed.

Illustratively, the anode can be formed of, for example, a transparent conductive material having a high work function, and its electrode material can include indium tin oxide (ITO), indium zinc oxide (IZO), indium gallium oxide (IGO), gallium zinc oxide (GZO), zinc oxide (ZnO), indium oxide (In2O3), aluminum zinc oxide (AZO), carbon nanotubes, and the like; and the cathode can be formed of, for example, a material having high conductivity and a low work function, and its electrode material can include alloy such as magnesium aluminum alloy (MgAl) and lithium aluminum alloy (LiAl), or simple metal such as magnesium (Mg), aluminum (Al), lithium (Li), and silver (Ag). A material of the emission layer can be selected according to a color of the light emitted therefrom. For example, the material of the emission layer includes a fluorescent emission material or a phosphorescent emission material. For example, in at least one embodiment of the present disclosure, the emission layer can employ a doped system, i.e., a dopant is blended into a host emission material to obtain a usable emission material. For example, the host emission material can employ a metal compound material, anthracene derivative, aromatic diamine compound, triphenylamine compound, aromatic triamine compound, biphenyldiamine derivative, triarylamine polymer, and the like.

For example, referring to FIG. 2, the driving backplane 200 can further comprise: a GOA (Gate Driver On Array) circuit 22 connected to the gate lines GL, which is configured to provide the gate driving signals for the gate lines GL and to provide the emission control signals for the emission control signal lines EM. For example, in the case where the display panel has N rows of sub-pixels, the GOA circuit 22 can comprise N cascaded GOA units, each GOA unit comprises two scanning signal output ends (i.e., signal sources providing the gate driving signal and the reset signal), the N cascaded GOA units comprise 2N scanning signal output ends, which are $O_{1A}, O_{2A}, \ldots, O_{nA}$ and $O_{1B}, O_{2B}, \ldots, O_{nB}$, the gate lines GL_A (i.e., N gate lines GL_A) respectively coupled to the pixel circuits 221 in the sub-pixels from the first row to the nth row are, in one-to-one correspondence, respectively coupled to the N first scanning signal output ends $O_{1A}, O_{2A}, \ldots, O_{nA}$ of the gate driving circuit, and the gate lines GL_B (i.e., N gate lines GL_B) respectively coupled to the pixel circuits 221 in the sub-pixels from the first row to the nth row are, in one-to-one correspondence, respectively coupled to the N second scanning signal output ends $O_{1B}, O_{2B}, \ldots, O_{nB}$ of the gate driving circuit; in addition, each GOA unit can further comprise an emission control signal output end, and the GOA circuit 22 can further comprise N emission control signal output ends (i.e., signal sources providing emission control signals), which are Q1, Q2, ..., and Qn, respectively; the emission control signal lines EM (i.e., N emission control signal lines EM) electrically connected to the pixel circuits 221 in the sub-pixels from the first row to the nth row are EM(1), EM(2), ... EM(N), respectively; and the N emission control signal lines EM are respectively coupled to the N emission control signal output ends of the GOA circuit 22. The disposition of the GOA circuit 22 can not only reduce voltage attenuation on the signal lines, but also can reduce a bonding process of an external IC, which possibly improves productivity and reduces product cost, and can make a frame of the display device narrower, to achieve a better display effect.

Illustratively, the driving backplane 200 can be driven in a one-side manner, that is, only one side of the driving backplane 200 is provided with one GOA circuit 22, and the GOA circuit 22 scans at least one of the plurality of gate lines, the plurality of the reset signal lines, and the plurality of emission control lines line by line.

Illustratively, referring to FIGS. 4 to 5, the driving backplane 200 can further comprise: a source driving circuit 21 connected to the data lines DL and configured to provide data signals for the data lines DL. For example, in the case where the display panel has M columns of sub-pixels, the source driving circuit 21 has 2M signal output ends (i.e., signal sources providing data signals), and the data lines DL_A (i.e., M data lines DL_A) respectively coupled to the pixel circuits 221 in the sub-pixels from the first column to the Mth column are, in a one-to-one correspondence, coupled to the data lines DL_B (i.e., M data lines GL_B).

Illustratively, referring to FIG. 2, the plurality of signal lines 222 can further include a plurality of GOA circuit control signal lines coupled to each GOA unit of the GOA circuit 22, and each GOA circuit control signal line is configured to transmit a control signal to the GOA circuit. The plurality of GOA circuit control signal lines can include: a frame start signal line STV, and clock signal lines CLK and CLKB. Herein, the frame start signal line STV is configured to transmit a frame start signal to each GOA unit; and the clock signal lines CLK and CLKB are configured to transmit clock signals to the GOA units, and a voltage phase of a clock signal transmitted by the clock signal line CLK is opposite to that of a clock signal transmitted by CLKB.

Illustratively, the driving backplane 200 can further comprise a conductive pattern layer 230 on a side of the base substrate 210 away from the pixel circuit layer 220. For example, the conductive pattern layer 230 can be disposed on a side of the base substrate 210 away from the pixel circuit layer 220, and the base substrate 210 can be located between the conductive pattern layer 230 and the pixel circuit layer 220. The pattern layer herein refers to a film layer formed through a single patterning process. The patterning process refers to a process capable of forming at least one pattern having a certain shape. For example, a thin film is formed on the base substrate 210 through any of a variety of film forming processes such as deposition, coating, sputtering, etc., and then the thin film is patterned to form a film layer including at least one pattern, which is called a pattern layer. Steps of the patterning comprises: coating photoresist, exposing, developing, etching, stripping photoresist, and so on. In this embodiment, a position relation of a plurality of patterns belonging to a same pattern layer is referred to as a same-layer disposition.

Illustratively, the conductive pattern layer 230 comprises a plurality of first conductive patterns 231 and at least one second conductive pattern 234, each first conductive pattern 231 is coupled to one signal line 222 through at least one conductive portion 250, and each second conductive pattern 234 is coupled to at least one third connection portion 260.

Illustratively, each first conductive pattern 231 is coupled to one signal line 222 by at least one conductive portion 250. For example, referring to FIG. 2, when the pixel circuit layer 220 comprises the GOA circuit 22, each frame start signal line STV, the clock signal lines CLK and CLKB are coupled to one first conductive pattern 231 through at least one conductive portion 250, respectively, and the first power voltage line VDD and the second power voltage line VSS can also realize a corresponding control through the source driving circuit 21 to transmit a corresponding electrical signal to the pixel circuit 221; and when the pixel circuit layer 220 does not comprise the above driving circuits, and comprises only the signal lines 222 such as the gate lines GL, the data lines DL, the emission control signal lines EM, the initialization signal lines Init, the first power voltage lines VDD, the second power voltage lines VSS, and the reset signal lines Reset and Reset', each signal line is coupled to one first conductive pattern 231 through at least one conductive portion 250.

Illustratively, referring to FIGS. 4 to 5, a first edge 213 is an edge closest to the first conductive patterns 231 coupled to the plurality of data lines DL among the edges of the base substrate 210, a second edge 214 is an edge closest to the first conductive patterns 231 coupled to the plurality of first power voltage lines VDD and the second power voltage lines VSS among the edges of the base substrate 210, and the first edge 213 is parallel to the second edge 214. That is, the first conductive patterns 231 coupled to the plurality of data lines DL and the first conductive patterns 231 coupled to the plurality of first power voltage lines VDD and the second power voltage lines VSS are separately located in peripheral areas of the edges, which are parallel to each other in a same direction, of the base substrate 210. The above disposition can make the wiring of the conductive pattern layer 230 more reasonable, and avoids winding with the first power voltage lines VDD, the second power voltage lines VSS and the data lines DL, thereby reducing the wiring difficulty and controlling the production cost.

Illustratively, referring to FIG. 5, the plurality of first conductive patterns 231 coupled to the plurality of first power voltage lines VDD and the second power voltage lines VSS close to the second edge 214 can be divided into only one group, the first conductive patterns 231 coupled to the plurality of first power voltage lines VDD and the first conductive patterns 231 coupled to the plurality of second power voltage lines VSS in the group are interleaved, and all the first conductive patterns 231 in the group are coupled to the printed circuit board 330 through one flexible printed circuit 320. The above disposition can make the wiring of the conductive pattern layer 230 more reasonable, and avoids winding between the first conductive patterns 231 coupled to the first power voltage lines VDD and the second power voltage lines VSS, thereby further reducing the wiring difficulty and controlling the production cost.

Illustratively, referring to FIG. 4, the plurality of first conductive patterns 231 coupled to the plurality of first power voltage lines VDD and the second power voltage lines VSS close to the second edge 214 can be divided into a plurality of groups, and each group comprises the first conductive patterns 231 coupled to the plurality of first power voltage lines VDD and the first conductive patterns 231 coupled to the plurality of second power voltage lines VSS, which are interleaved. When the plurality of first conductive patterns 231 are divided into a plurality of groups, a plurality of ICs can be disposed on the printed circuit board 330, and each IC is, through one flexible printed circuit 320, coupled to a plurality of first conductive patterns 231 in one group. When the plurality of ICs are disposed on the printed circuit board 330, a size of a single IC is relatively small, and its power consumption is also relatively small, so that a small integration area is required for integration of the plurality of ICs, thereby contributing to reduction of the size of the printed circuit board 330 and facilitating the control of the production cost.

Figure 6A:
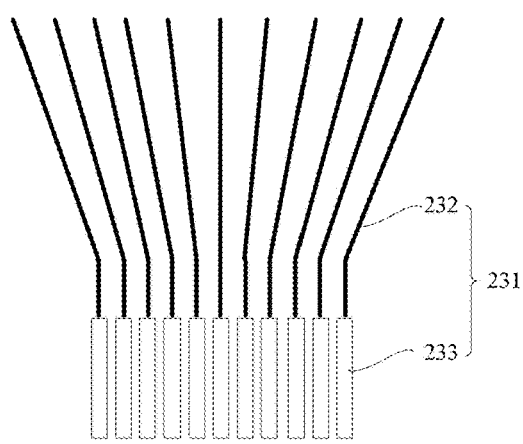
FIG. 6(*a*) is a structural diagram of a first conductive pattern according to at least one embodiment of the present disclosure.
Figure 6B:
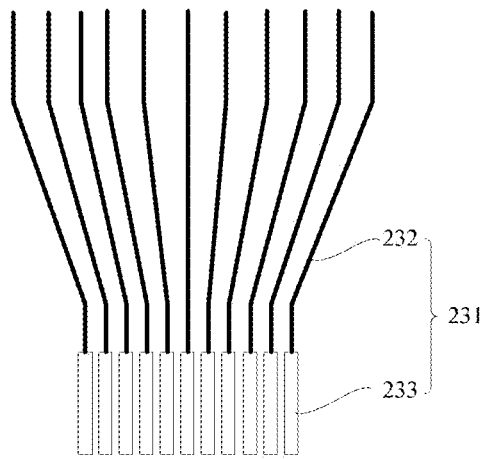

Illustratively, each first conductive pattern 231 comprises one conductive lead 232 and one conductive PAD 233. Each conductive lead 232 has one end coupled to one signal line 222 through at least one of the conductive portions 250 and the other end coupled to the conductive PAD 233 in this conductive pattern layer 230. For example, referring to FIG. 6(a), when the first conductive pattern 231 has a shape shown in FIG. 6(a), each conductive lead 232 has one end coupled to one signal line 222 through one conductive portion 250; and referring to FIG. 6(b), when the first conductive pattern 231 has a shape shown in FIG. 6(b), each conductive lead 232 can has one end coupled to one signal line 222 through one or more conductive portions 250. In the case where each conductive lead 232 has one end coupled to one signal line 222 through the plurality of conductive portions 250, when one of the plurality of conductive portions 250 is in a failed connection, the signal line 222 can also be electrically connected to the corresponding conductive lead 232 through another conductive portion 250, thereby improving the reliability of the connection. A structure of the second conductive pattern 234 is the same as that of the first conductive pattern 231, and is not repeated herein.

Illustratively, the plurality of first conductive patterns 231 are divided into a plurality of groups, each group comprises at least two first conductive patterns 231, and a distance between two adjacent conductive PADs 233 in each group is less than a distance between two adjacent conductive leads 232. For example, referring to FIGS. 4 to 6(b), each group comprises the plurality of conductive pattern layers 230, the distance between the two adjacent conductive PADs 233 is less than the distance between the two adjacent conductive leads 232, so that fan-out wiring (also known as Fanout, fan-out line, concentrated wiring, etc.) is formed, which can concentrate the signal lines 222 in a large area into a small area and facilitates subsequent circuit connection design.

Figure 7:
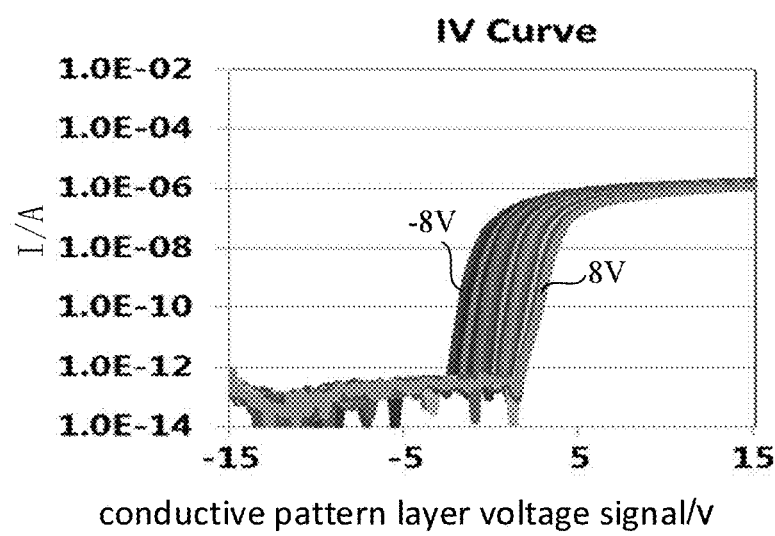
FIG. 7 is a plot of an IV curve according to at least one embodiment of the present disclosure.
Figure 8:
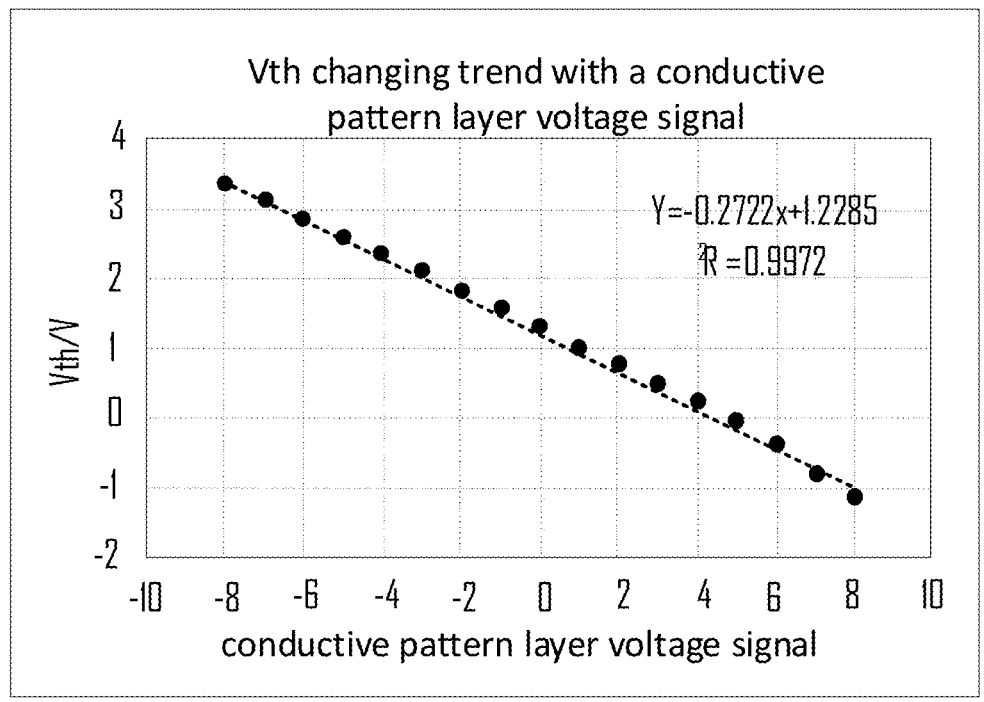
FIG. 8 is a plot of a Vth changing trend with a conductive pattern layer voltage signal according to at least one embodiment of the present disclosure.
Figure 9:
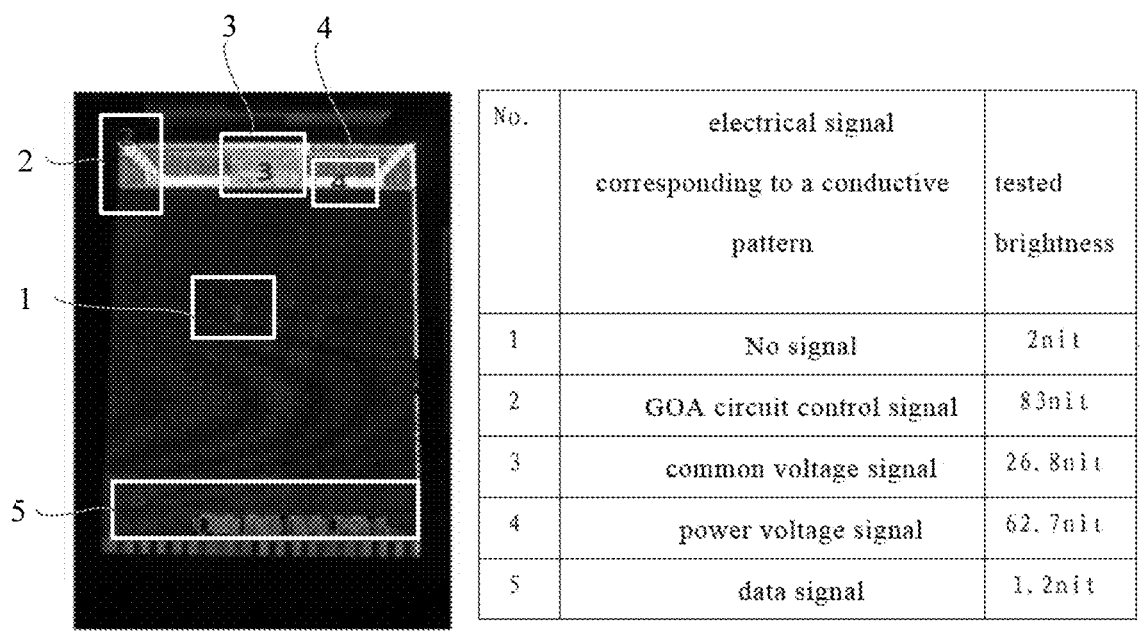
FIG. 9 is a diagram illustrating brightness detection results of different display areas of a display panel according to at least one embodiment of the present disclosure.

Illustratively, an orthographic projection of at least part of the pixel circuit 221 on the base substrate 210 and an orthographic projection of the conductive pattern layer 230 on the base substrate 210 have an overlapping area, that is, an orthographic projection of the active layer 224 of the transistor 223 of at least part of the pixel circuit 221 of the pixel circuit layer 220 on the base substrate 210 and the orthographic projection of the conductive pattern layer 230 on the base substrate 210 have an overlapping area. Each of the first conductive patterns 231 transmits a corresponding electrical signal, and a changing voltage signal output by the conductive pattern layer 230 comprising the plurality of first conductive patterns 231 will affect the characteristics of the active layer 224 of the transistor 223 located directly above at least one (e.g., which can be a plurality of) conductive pattern layer 230, so that a threshold voltage ($V_{th}$ for short) of the transistor 223 changes, which affects a base current of the transistor 223 and ultimately affects the emission effect. Taking the transistor M4 being an NMOS transistor as an example, when the voltage signal output by the conductive pattern layer 230 gradually changes from −8V to 8V, the base current corresponding to the operating state, which gradually transits from a cut-off state to an amplification state and finally to a saturation conduction period, of the transistor M4 located directly above at least one first conductive pattern 231, is detected, and detected values are plotted to obtain an IV curve as shown in FIG. 7 and a relationship curve of the threshold voltage of the transistor M4 corresponding to the voltage signal output by the conductive pattern layer 230 as shown in FIG. 8. It can be seen that when the voltage signal output by the conductive pattern layer 230 gradually increases from −8V to 8V, the IV curve of the transistor M4 gradually moves to the right, and the corresponding threshold voltage of the transistor M4 gradually decreases. When actually displayed, the voltage signal output by the conductive pattern layer 230 changes continuously, and accordingly, the threshold voltage of the transistor M4 also changes continuously, which finally causes uneven display brightness of the AA area of the display panel 100. For example, referring to FIG. 9, when a same data signal is input to all the pixel circuits 221 and brightness values of different display areas numbered 1 to 6 in the AA area of the display panel 100 are detected, it can be seen that there are great differences between the brightness of the different display areas, i.e., the display brightness is not uniform.

Based on this, in some embodiments of the present disclosure, referring to FIG. 3, the driving backplane 200 can further comprise a shielding layer 240 located between the pixel circuit layer 220 and the conductive pattern layer 230 and configured to shield interference, to the transistor 223, of the voltage signal output by the conductive pattern layer 230. Illustratively, orthographic projections of the plurality of pixel circuits 221 on the base substrate 210 and an orthographic projection of the shielding layer 240 on the base substrate 210 have an overlapping area, thereby shielding the influence, on the characteristics of the active layer 224, of the changing voltage signal output by the conductive pattern layer 230, avoiding the influence, on the base current of the transistor 223, of the change of the threshold voltage of the transistor 223 subject to the interference, and finally improving the emission effect.

Illustratively, an orthographic projection of an edge of the shielding layer 240 on the base substrate 210 completely coincides with the edge of the base substrate 210, that is, the orthographic projection of the shielding layer 240 on the base substrate 210 completely covers the orthographic projection of the conductive pattern layer 230 on the base substrate 210, which avoids the influence, on all the transistors 223, of the changing voltage signal output by the conductive pattern layer 230, and thus achieves the optimal interference shielding effect.

A material of the shielding layer 240 can be a metal material or metal oxide, and specifically, can be molybdenum (Mo) or molybdenum alloy, titanium (Ti) or titanium alloy, aluminum (Al) or aluminum alloy, indium tin oxide (ITO), and indium zinc oxide (IZO).

Illustratively, the shielding layer 240 can be connected to a constant voltage to shield an interference signal applied to the active layer 224 of the transistor 223 by the conductive pattern layer 230. It can be understood that, since the shielding layer 240 needs to be connected to the constant voltage to shield the interference signal, the shielding layer 240 is not indirect contact with the conductive pattern layer 230 and the pixel circuit layer 220, but is isolated by the insulating layer. As another example, the constant voltage to which the shielding layer 240 can be connected can be 0V (i.e., grounded). When the constant voltage is 0V, the interference, to the transistor 223, of the voltage signal output by the conductive pattern layer 230 can not only be shielded, but the signal interference, to the metal lead, of a non-0V constant voltage can also be avoided.

Illustratively, referring to FIG. 3, the driving backplane 200 further comprises at least one (e.g., which can be one) third connection portion 260 located in the second conductive via 212, the conductive pattern layer 230 further comprises at least one (e.g., which can be one) second conductive pattern 234, and the shielding layer 240 is coupled to the second conductive pattern 234 through the third connection portion 260. Herein, each third connection portion 260 completely fills one second conductive via 212, and the second conductive pattern 234 is configured to transmit a constant voltage signal to the shielding layer 240.

Illustratively, referring to FIGS. 3 and 10, the shielding layer 240 has a plurality of hollow areas (also called openings, vias, etc.) 241, each conductive portion 250 is located in one hollow area 241, and there is a gap everywhere between an orthographic projection of each hollow area 241 on the base substrate 210 and an orthographic projection of the conductive portion 250 located therein on the base substrate 210. That is, an orthographic projection of an edge of each hollow area 241 on the base substrate 210 and an orthographic projection of an edge of the conductive portion 250 located therein on the base substrate 210 have no overlapping part. A shape of the hollow area 241 is not limited herein, as long as each hollow area 241 can realize electrical insulation between the conductive portion 250 located therein and the shielding layer 240. The second connection portion 252 and the shield layer 240 are disposed in the same layer. The shielding layer 240, the hollow area 241, the conductive portion 250 and the third connection portion 260 can be formed through a single patterning process, and on the premise of shielding interference, the simplification of the processing steps facilitates the control of the production cost.

In yet another aspect, some embodiments of the present disclosure provide a display panel 100, which comprises the driving backplane 200 described above, and further comprises a driving circuit 300 located on a side of the base substrate 210 away from the shielding layer 240 and at least one (e.g., which can be a plurality of) light emitting device L.

Illustratively, the display panel 100 comprises the driving circuit 300, the driving backplane 200, and at least one (e.g., which can be a plurality of) light emitting device L. The driving circuit 300 is configured to provide a driving signal for the driving backplane 200, and the driving backplane 200 is configured to drive the light emitting device L to emit light under the control of the driving signal. As shown in FIG. 1, at least one sub-pixel P (e.g., each sub-pixel P) of the display panel comprises a pixel circuit 221 and the light emitting device L. The pixel circuit 221 herein is coupled to the light emitting device L, and the pixel circuit 221 is configured to drive the light emitting device L to emit light. Illustratively, a plurality of pixel circuits 221 are arranged in an array.

Illustratively, a conductive pattern layer 230 is located on a side of the base substrate 210 away from a pixel circuit layer 220, i.e., the conductive pattern layer 230 and the driving circuit 300 are located on a same side of the base substrate 210. At this time, the shielding layer 240 can be located on a side of the base substrate 210 away from the pixel circuit layer 220, or on a side of the base substrate 210 close to the pixel circuit layer 220. No matter which side of the base substrate 210 the shielding layer 240 is located on, it can be understood that the shielding layer 240 is not in direct contact with the conductive pattern layer 230 and the pixel circuit layer 220, but is separated by an insulating layer.

Illustratively, the driving circuit 300 and the conductive pattern layer 230 which are located on the same side of the base substrate 210 are coupled, and each signal line 222 in the pixel circuit layer 220 located on the other side of the base substrate 210 is coupled to one first conductive pattern 231 through at least one (e.g., which can be a plurality of) conductive portion 250. That is, the driving circuit 300 and the pixel circuit 221 located on both sides of the base substrate 210 can be electrically connected through a conductive portion 250 and a first conductive pattern 231 in the driving backplane 200 without the need of a flexible printed circuit 320, so that there is no need to reserve a required space caused by the bending of the flexible printed circuit 320 on a side surface of the base substrate 210, which can further reduce the area of the frame of the display panel 100 and facilitate the realization of "zero frame".

Illustratively, the driving circuit 300 comprises a voltage end 340, and the voltage end 340 is coupled to a second conductive pattern 234 and configured to provide a constant voltage for the shielding layer 240 to achieve interference shielding. The voltage end 340 herein can be a grounding end. Illustratively, the voltage end 340 can be disposed on a printed circuit board 330.

Illustratively, referring to FIGS. 4 to 5, the driving circuit 300 is coupled to the conductive pattern layer 230 on the driving backplane 200 through the flexible printed circuit 320. For example, the flexible printed circuit 320 serves as a connector, and it is realized that the plurality of first conductive patterns 231 are, through the flexible printed circuit 320, electrically connected to the printed circuit board 330 in the driving circuit 300. The electrical connection of components through the flexible printed circuit 320 can improve the reliability of the electrical connection, and thus improves the service life of the display panel 100.

Illustratively, referring to FIGS. 4 to 5, each of the first conductive patterns 231 coupled to a plurality of data lines DL is coupled to the printed circuit board 330 through a chip on film 310 and the flexible printed circuit 320 sequentially.

The volume of the chip on film 310 is small, a space between its pins is small, the volume of the printed circuit board 330 is large, and a space between its pins is relatively large, i.e. the pins of the chip on film 310 and the pins of the printed circuit board 330 are different in distance, and cannot be directly connected, so that the flexible printed circuit 320 is needed to realize the coupling between components with different pin distances, thereby reducing the processing difficulty and improving the connection precision and the connection reliability.

Finally, it should be noted that: the above embodiments are only intended to describe the technical solution of the present disclosure, not to limit it; although the present disclosure has been described in detail with reference to the foregoing embodiments, it should be understood by one of ordinary skill in the art that: the technical solutions described in the foregoing embodiments can still be modified, or some technical features thereof can be equivalently replaced; and such modifications and substitutions do not depart from the spirit and scope of the technical solutions of the embodiments of the present disclosure.

What is claimed is:

1. A driving backplane comprising:
   a base substrate having a plurality of first conductive vias;
   a conductive portion, at least part of which is disposed in one first conductive via;
   a pixel circuit layer disposed on the base substrate and comprising a plurality of pixel circuits and a plurality of signal lines, each signal line being coupled to at least one of the pixel circuits;
   a conductive pattern layer located on a side of the base substrate away from the pixel circuit layer and comprising a plurality of first conductive patterns; and
   a shielding layer located on a side of the base substrate away from the conductive pattern layer and located between the pixel circuit layer and the conductive pattern layer, wherein orthographic projections of the plurality of pixel circuits on the base substrate and an orthographic projection of the shielding layer on the base substrate have an overlapping area, the shielding layer has a plurality of hollow areas, and at least one of the conductive portions is located in one hollow area;
   wherein each of the plurality of signal lines is coupled to one first conductive pattern through at least one of the conductive portions,
   wherein the conductive portion comprises: a first connection portion filled in the first conductive via, and a second connection portion located outside the first conductive via and in contact with the first connection portion; and
   the second connection portion and the shielding layer are disposed in a same layer.

2. The driving backplane according to claim 1, wherein the base substrate further has a second conductive via;
   the driving backplane further comprises a third connection portion located in the second conductive via;
   the conductive pattern layer further comprises a second conductive pattern; and
   the shield layer is coupled to the second conductive pattern through the third connection portion.

3. The driving backplane according to claim 1, wherein the pixel circuit layer further comprises: a GOA circuit connected to the plurality of pixel circuits; and
   the plurality of signal lines comprise: a plurality of GOA circuit control signal lines coupled to the GOA circuit, each GOA circuit control signal line being configured to transmit a control signal to the GOA circuit.

4. The driving backplane according to claim 1, wherein the plurality of signal lines comprise: at least one of gate lines, data lines, first power voltage lines and second power voltage lines.

5. The driving backplane according to claim 4, wherein the plurality of signal lines comprise a plurality of data lines, a plurality of first power voltage lines and a plurality of second power voltage lines, and an edge closest to first conductive patterns coupled to the plurality of data lines among edges of the base substrate is a first edge;
   an edge closest to first conductive patterns coupled to the plurality of first power voltage lines and the plurality of second power voltage lines among the edges of the base substrate is a second edge; and
   the first edge is parallel to the second edge.

6. The driving backplane according to claim 1, wherein each conductive pattern comprises: a conductive lead and a conductive PAD;
   the conductive lead has one end coupled to one signal line through at least one of the plurality of conductive portions, and has the other end coupled to the conductive PAD in the conductive pattern;
   a plurality of conductive patterns are divided into a plurality of groups, each group comprising at least two conductive patterns; and
   in each group, a distance between two adjacent conductive PADs is less than a distance between two adjacent conductive leads.

7. The driving backplane according to claim 1, wherein an orthographic projection of an edge of the shielding layer on the base substrate completely coincides with the edge of the base substrate.

8. A display panel comprising the driving backplane according to claim 1, wherein the display panel further comprises a driving circuit located on a same side of the base substrate as the conductive pattern layer, and the driving circuit is coupled to the conductive pattern layer.

9. The display panel according to claim 8, wherein the driving circuit is coupled to the conductive pattern layer on the driving backplane through a flexible circuit board.

10. The display panel according to claim 9, wherein each of first conductive patterns coupled to a plurality of data lines is coupled to a printed circuit board through a chip on film and the flexible circuit board sequentially.

11. The display panel according to claim 10, wherein the driving circuit comprises a voltage end coupled to a second conductive pattern.

12. The display panel according to claim 11, wherein the voltage end is a grounding end.

13. The display panel according to claim 8, wherein the display panel further comprises at least one light emitting device configured to emit light under the driving of the driving backplane.

14. A display device comprising the display panel according to claim 8.

15. The display device according to claim 14, wherein the conductive portion comprises: a first connection portion filled in the first conductive via, and a second connection portion located outside the first conductive via and in contact with the first connection portion; and
   the second connection portion and the shielding layer are disposed in a same layer.

16. The display device according to claim 14, wherein the base substrate further has a second conductive via;
   the driving backplane further comprises a third connection portion located in the second conductive via;

the conductive pattern layer further comprises a second conductive pattern; and the shield layer is coupled to the second conductive pattern through the third connection portion.

17. The display device according to claim 14, wherein the pixel circuit layer further comprises: a GOA circuit connected to the plurality of pixel circuits; and the plurality of signal lines comprise: a plurality of GOA circuit control signal lines coupled to the GOA circuit, each GOA circuit control signal line being configured to transmit a control signal to the GOA circuit.

18. The display device according to claim 14, wherein the plurality of signal lines comprise: at least one of gate lines, data lines, first power voltage lines and second power voltage lines.

* * * * *